(12) United States Patent  
Park et al.

(10) Patent No.: US 6,967,435 B2  
(45) Date of Patent: Nov. 22, 2005

(54) ACTIVE MATRIX ORGANIC ELECTROLUMINESCENT DISPLAY AND FABRICATING METHOD THEREOF

(75) Inventors: Jae-Yong Park, Gyeonggi-do (KR); Choong-Keun Yoo, Incheon (KR)

(73) Assignee: LG.Philips LCD Co., Ltd., Seoul (KR)

( * ) Notice: Subject to any disclaimer, the term of this patent is extended or adjusted under 35 U.S.C. 154(b) by 107 days.

(21) Appl. No.: 10/329,761

(22) Filed: Dec. 27, 2002

(65) Prior Publication Data

US 2003/0146696 A1 Aug. 7, 2003

(30) Foreign Application Priority Data

Dec. 29, 2001 (KR) .................... 10-2001-0087707

(51) Int. Cl.[7] ............................ H01J 1/62; H05B 33/00
(52) U.S. Cl. ...................... 313/501; 313/500; 313/504; 313/112
(58) Field of Search ................. 313/498–512, 313/110–112; 428/690, 917; 315/169.3; 257/40, 72; 349/106, 45, 76

(56) References Cited

U.S. PATENT DOCUMENTS

| | | | |
|---|---|---|---|
| 5,294,870 A | 3/1994 | Tang et al. | 313/504 |
| 6,445,005 B1 * | 9/2002 | Yamazaki et al. | 257/72 |
| 6,580,213 B2 * | 6/2003 | Yamazaki | 313/506 |
| 6,653,778 B1 * | 11/2003 | Tomiuchi et al. | 313/501 |
| 6,689,492 B1 * | 2/2004 | Yamazaki et al. | 428/690 |

FOREIGN PATENT DOCUMENTS

| | | | | | |
|---|---|---|---|---|---|
| JP | 2001126862 A | * | 5/2001 | | H05B 33/04 |
| JP | 2003243172 A | * | 8/2003 | | H05B 33/14 |

* cited by examiner

Primary Examiner—Karabi Guharay
(74) Attorney, Agent, or Firm—Morgan Lewis & Bockius LLP

(57) ABSTRACT

An active matrix organic electroluminescent display device includes a first substrate and a second substrate facing and spaced apart from each other, a thin film transistor on an inner surface of the first substrate, a first electrode connected to the thin film transistor, an organic electroluminescent layer on the first electrode, a second electrode on the organic electroluminescent layer, a passivation layer on the second electrode, a black matrix on an inner surface of the second substrate, the black matrix includes a plurality of open portions, a color filter layer at the plurality of open portions, a color changing layer on the color filter layer, an overcoat layer on the color changing layer, and an adhesive film between the passivation layer and the overcoat layer.

18 Claims, 7 Drawing Sheets

ACTIVE MATRIX ORGANIC ELECTROLUMINESCENT DISPLAY AND FABRICATING METHOD THEREOF

The present invention claims the benefit of the Korean Patent Application No. P2001-87707 filed in Korea on Dec. 29, 2001, which is hereby incorporated by reference.

BACKGROUND OF THE INVENTION

1. Field of the Invention

The present invention relates to an organic electroluminescent display device, and more particularly, to an active matrix organic electroluminescent display device including a thin film transistor and a fabricating method thereof.

2. Discussion of the Related Art

A cathode ray tube (CRT) has been commonly used as a display screen for devices such as televisions and computer monitors. However, a CRT has the disadvantages of being large, heavy, and requiring a high drive voltage. As a result, flat panel displays (FPDs) that are smaller, lighter, and require less power have grown in popularity. Liquid crystal display (LCD) devices, plasma display panel (PDP) devices, field emission display (FED) devices, and electroluminescent display (ELD) devices are some of the types of FPDs that have been introduced in recent years.

An ELD device may either be an inorganic electroluminescent display device or an organic electroluminescent display (OELD) device depending upon the source material used to excite carriers in the device. OELD devices have been particularly popular because they have bright displays, low drive voltages, and can produce natural color images incorporating the entire visible light range. Additionally, OELD devices have a preferred contrast ratio because they are self-luminescent. OELD devices can easily display moving images because they have a short response time of only several microseconds. Moreover, such devices are not limited to a restricted viewing angle as other ELD devices are. OELD devices are stable at low temperatures. Furthermore, their driving circuits can be cheaply and easily fabricated because the circuits only require a low operating voltage. In addition, the manufacturing process of OELD devices is relatively simple.

In general, an OELD device emits light by injecting electrons from a cathode electrode and holes from an anode electrode into an emissive layer, combining the electrons with the holes, generating an exciton, and transitioning the exciton from an excited state to a ground state. Since the mechanism by which an OELD produces light is similar to a light emitting diode (LED), the organic electroluminescent display device may also be called an organic light emitting diode.

In an organic electroluminescent display device, multiple organic electroluminescent layers may be used in which each layer emits red light, green light, or blue light in order to display full color images. Because any of the organic electroluminescent layers may break down over the course of time, it may be difficult to maintain the range of all possible colors when the organic electroluminescent display device has been driven for a long period of time. To solve this problem, a method of displaying full color images by using a single organic electroluminescent layer for all pixels and a color changing medium has been suggested in U.S. Pat. No. 5,294,870, which are hereby incorporated by reference. This method will be illustrated in FIGS. 1 to 3.

FIG. 1 is a plan view of an organic electroluminescent display device according to the related art. In FIG. 1, a planarization layer 101 is formed on a substrate, and a plurality of first electrodes R1–R5, which are spaced apart from each other, are formed on the planarization layer 101 along a first direction. An organic electroluminescent layer 8 is formed on the plurality of first electrodes R1–R5. The organic electroluminescent layer 8 is electrically connected to the plurality of first electrodes R1–R5. A plurality of second electrode portions C1–C6, which are spaced apart from each other, are formed on the organic electroluminescent layer 8 along a second direction that is substantially perpendicular to the first direction. Each second electrode portion C1–C6 includes three sub-electrodes "a," "b" and "c." The second electrode portion C1-C6 crosses the first electrode R1–R5, thereby defining pixel regions, of which a representative pixel region is "P." The pixel region "P" includes three sub-pixel regions "Rp," "Gp" and "Bp" of red, green and blue that are defined by the sub-electrodes "a," "b" and "c" and the first electrodes R1–R5. External signals are applied through a peripheral portion "A" where the electroluminescent layer 8 is not formed.

FIG. 2 is a cross-sectional view of the organic electroluminescent display device of FIG. 1 taken along II—II according to the related art. FIG. 3 is a cross-sectional view of the organic electroluminescent display device of FIG. 1 taken along III—III according to the related art.

In FIGS. 2 and 3, green color changing medium "G" and red color changing medium "R" are formed on a substrate 2. The green and red color changing media "G" and "R" correspond to green and red sub-pixel regions "Gp" and "Rp," respectively. The green and red color changing media "G" and "R" may be made of a material not susceptible to a photolithographic process. Next, a planarization layer 4 is formed on the green and red color changing media "G" and "R" to planarize a surface of the substrate 2 and separate adjacent green and red sub-pixel regions "Gp" and "Rp." The planarization layer 4 is made of transparent insulating material through a spin coating method or a solgel method without an additional patterning process. The planarization layer 4 also protects the green and red color changing media "R" and "G." Next, a plurality of first electrodes "R1" and "R3" are formed on the planarization layer 4. The plurality of first electrodes "R1" and "R3" are made of transparent conductive material such as indium-tinoxide (ITO) to transmit light.

Next, a sidewall 6 is formed on the plurality of first electrodes "R1" and "R3" at a boundary of the green and red sub-pixel regions "Gp" and "Rp." The sidewall 6 may be formed through depositing and patterning photoresist. The sidewall 6 may be made of silicon oxide ($SiO_2$), silicon nitride ($SiN_x$) or aluminum oxide ($Al_2O_3$). Next, an organic electroluminescent layer 8 is formed on the sidewall 6 and the plurality of first electrodes "R1" and "R3." The organic electroluminescent layer 8 is made of a material emitting blue light. A plurality of sub-electrodes "a," "b" and "c," which function in combination as a second electrode, are formed on the organic electroluminescent layer 8. Preferably, the plurality of sub-electrodes "a," "b" and "c" are made of a material having a low work function so that each is substantially efficient for proper operation of the electroluminescent display device. When the plurality of sub-electrodes "a," "b" and "c" are formed through a sputtering method, the positioning of a target including a source material is important in order that the plurality of sub-electrodes "a," "b" and "c" are properly spaced. If the target is close to a first surface "X" of the sidewall 6, the source material is deposited on the first surface "X" of the sidewall 6, but the source material is not deposited on a second surface "Y" of the sidewall 6 and a portion of the organic electroluminescent layer 8 adjacent to the second surface "Y." Accordingly, the organic electroluminescent layer 8 has a gap between the adjacent sub-electrodes "a," "b" and "c" along a first direction.

The organic electroluminescent display device of FIGS. 1 to 3 is a passive matrix organic electroluminescent display device. In the passive matrix organic electroluminescent display device, scan lines are sequentially driven so that the brightness of each pixel may be appropriately determined. Accordingly, the brightness for which a pixel is driven should be the multiple of the desired average brightness and the number of scan lines required to obtain the desired average brightness. Thus, as the number of scan lines increases, the required supply voltage and supply current increase as well. An increase in the required supply voltage and supply current accelerates the degradation of a device and increases the power consumption of the device. Although a passive matrix organic electroluminescent display device may be adequate for small display devices, it is not an adequate solution in larger display devices.

SUMMARY OF THE INVENTION

Accordingly, the present invention is directed to an organic electroluminescent display device and a fabricating method thereof that substantially obviate one or more of the problems due to limitations and disadvantages of the related art.

An object of the present invention is to provide an organic electroluminescent display device that produces color of a high quality, consumes a relatively low amount of power and permits a large display screen, and a fabricating method thereof.

An object of the present invention is to provide an organic electroluminescent display device whose elements have substantially equivalent expected life spans by forming one organic electroluminescent layer over an entire surface of a substrate and emitting light through a color changing medium and a fabricating method thereof.

Another object of the present invention is to provide an organic electroluminescent display device that can be protected from an external impact by forming a thin film transistor and a color changing medium over different substrates and attaching the respective substrates and a fabricating method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescent display device includes a first substrate and a second substrate facing and spaced apart from each other, a thin film transistor on an inner surface of the first substrate, a first electrode connected to the thin film transistor, an organic electroluminescent layer on the first electrode, a second electrode on the organic electroluminescent layer, a passivation layer on the second electrode, a black matrix on an inner surface of the second substrate, the black matrix includes a plurality of open portions, a color filter layer at the plurality of open portions, a color changing layer on the color filter layer, an overcoat layer on the color changing layer, and an adhesive film between the passivation layer and the overcoat layer.

In another aspect, A method of fabricating an organic electroluminescent display device includes steps of forming a thin film transistor on a first substrate, forming a first electrode connected to the thin film transistor, forming an organic electroluminescent layer on the first electrode, forming a second electrode on the organic electroluminescent layer, forming a passivation layer on the second electroluminescent layer, forming a black matrix on a second substrate, the black matrix has a plurality of open portions, forming a color filter layer at the plurality of open portions, forming a color changing layer on the color filter layer, forming an overcoat layer on the color changing layer, and bonding the first substrate to the second substrate by interposing an adhesive film between the passivation layer and the overcoat layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
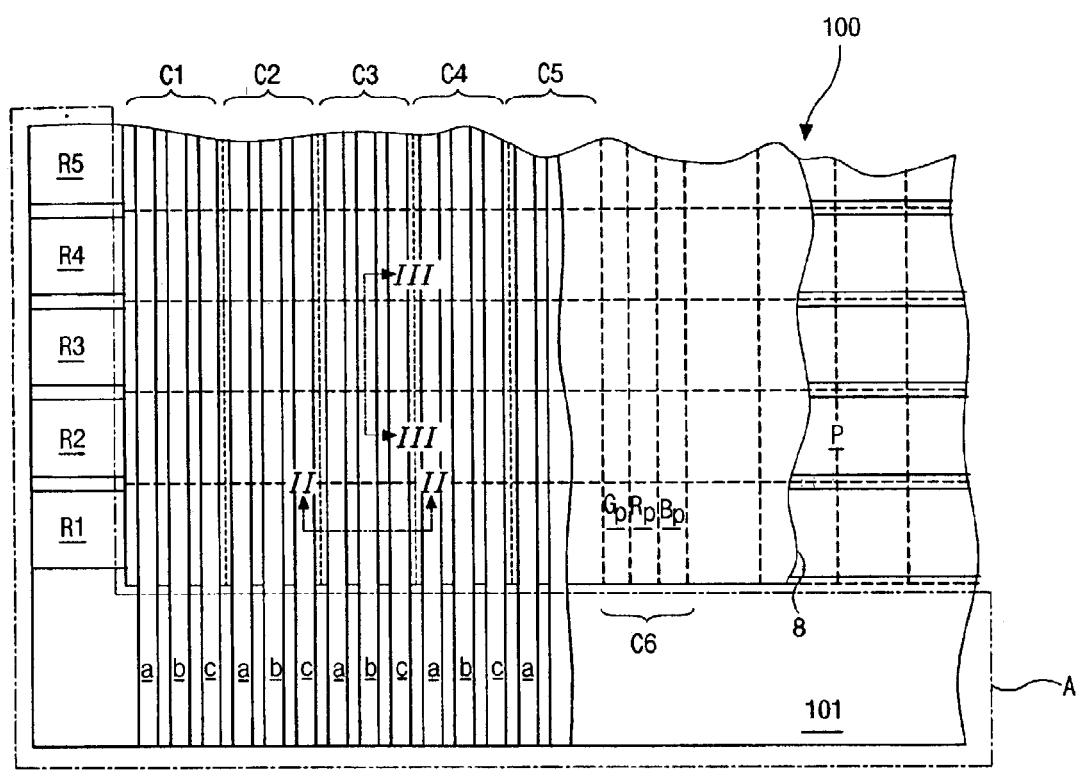
FIG. 1 is a plan view of a related art electroluminescent display device.
Figure 2:
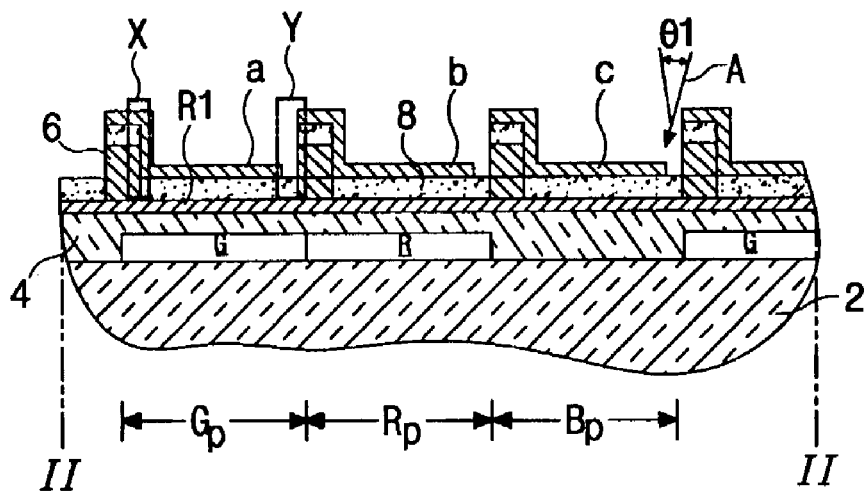
FIG. 2 is a cross-sectional view of the organic electroluminescent display device of FIG. 1 taken along II—II according to the related art.
Figure 3:
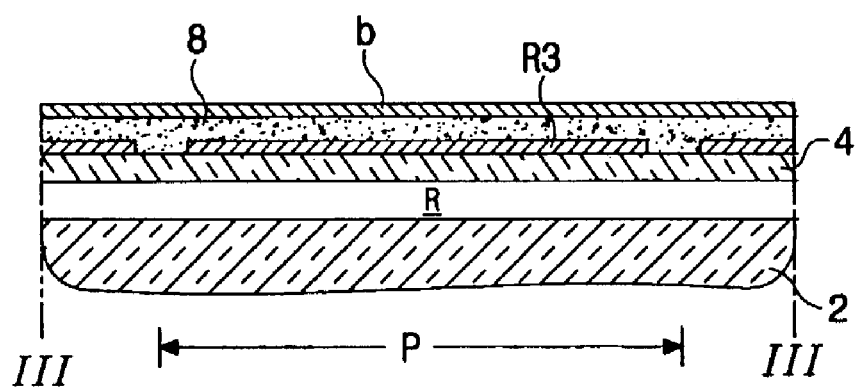
FIG. 3 is a cross-sectional view of the organic electroluminescent display device of FIG. 1 taken along III—III according to the related art.
Figure 4:
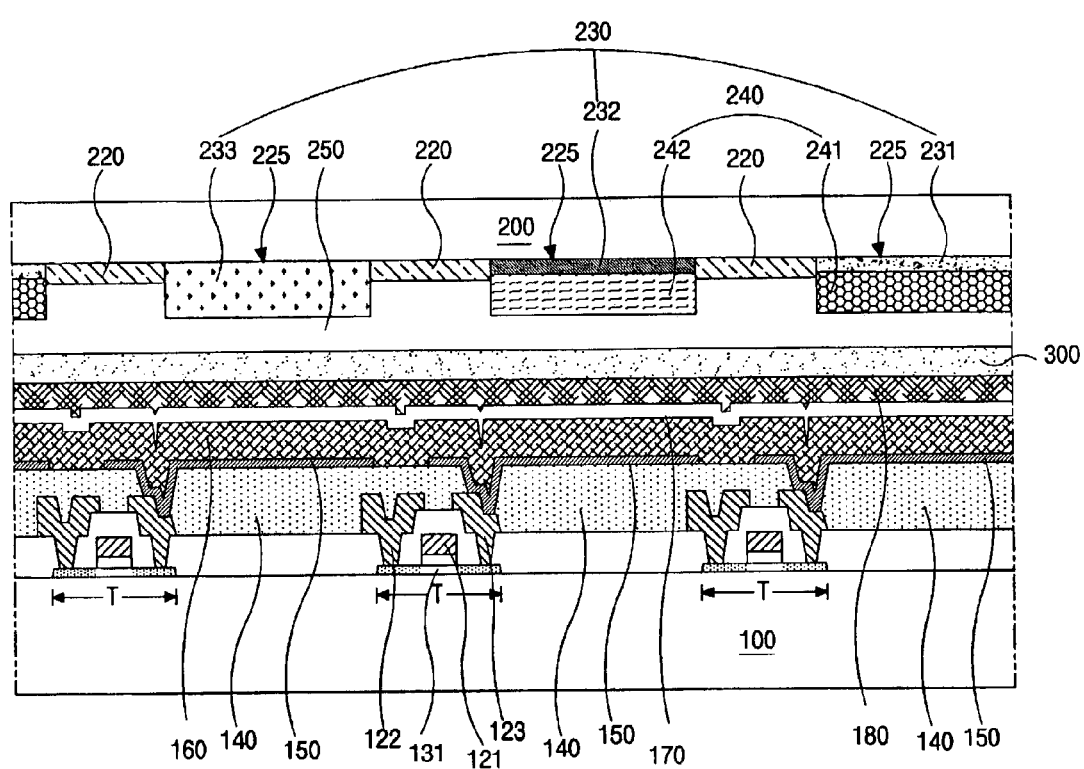
FIG. 4 is a cross-sectional view of an exemplary organic electroluminescent display device according to the present invention.

FIG. 4 is a cross-sectional view of an exemplary organic electroluminescent display device according to the present invention. In FIG. 4, a first substrate 100 and a second substrate 200 may face and be spaced apart from each other. A thin film transistor (TFT) "T" including a gate electrode 121, an active layer 131 of silicon, a source electrode 122, and a drain electrode 123 may be formed on an inner surface of the first substrate 100. A first passivation layer 140 may be formed on the TFT "T." The first passivation layer 140 may have a drain contact hole exposing the drain electrode 123 and may be composed of either inorganic insulating materials or organic insulating materials. A first electrode 150 of an opaque conductive material may be formed on the first passivation layer 140. An organic electroluminescent layer 160 emitting blue light may be formed on the first passivation layer 140. The organic electroluminescent layer 160 may cover an entire surface of the first substrate 100. A second electrode 170 composed of a transparent conductive material, such as indium-tin-oxide (ITO) or indium-zinc-oxide (IZO), may be formed on the organic electroluminescent layer 160. A second passivation layer 180 may be formed on the second electrode 170.

A black matrix 220 may be formed on an inner surface of the second substrate 200. The second substrate 200 may be made of a transparent material, such as glass or plastic. The black matrix 220 may be placed in a position corresponding to a TFT "T" and may have a plurality of open portions 225. A color filter layer 230, including first, second, and third sub-color filters 231, 232, and 233, may be formed at the plurality of open portions 225. For example, the first, second, and third sub-color filters 231, 232, and 233 may correspond to red, green, and blue, respectively. Alternatively, a different combination or order of sub-color filters may be used. Each of the first, second, and third sub-color filters 231, 232, and 233 may be formed at one open portion 225.

A color changing layer 240, including first and second color changing mediums 241 and 242, may be formed on the color filter layer 230. In FIG. 4, the first color changing medium 241, which may change color to red, may be formed on the first sub-color filter 231, and the second color changing medium 242, which may change color to green, may be formed on the second sub-color filter 232. An overcoat layer 250 may be formed on the color changing layer 240. Subsequently, an adhesive film 300 may be interposed between the second passivation layer 180 and the overcoat layer 250. The adhesive film 300 may be used to bond the first and second substrates 100 and 200 together.

Accordingly, an organic electroluminescent layer that emits blue light may be formed over an entire surface of a substrate and light may be emitted using the first and second color changing mediums of red and green. Since a thin film transistor may be used to drive an organic electroluminescent display device, a larger display device producing a higher quality display with reduced power consumption may be obtained. In addition, a transparent adhesive film may be attached to the organic electroluminescent layer that may shield and protect the organic electroluminescent layer from moisture and oxygen without optical loss. As a result, reliability may be improved. Furthermore, since a first electrode is made of an opaque conductive material and a second electrode is made of a transparent conductive material, light may be emitted toward the second substrate having a color changing layer.

A method of fabricating an organic electroluminescent display device according to an embodiment of the present invention is illustrated in FIGS. 5A to 6D.

Figure 5A:
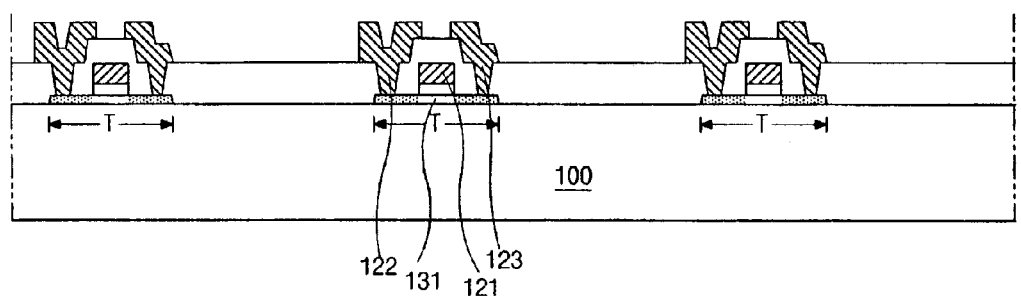
FIGS. 5A to 5D are cross-sectional views of an exemplary method of fabricating a first substrate for an organic electroluminescent display device according to the present invention.

FIGS. 5A to 5D are cross-sectional views of an exemplary method of fabricating a first substrate for an organic electroluminescent display device according to the present invention. FIGS. 6A to 6D are cross-sectional views of an exemplary method of fabricating a second substrate for an organic electroluminescent display device according to the present invention. In FIG. 5A, a thin film transistor (TFT) "T" may be formed on a first substrate 100. The TFT "T" may include a gate electrode 121, an active layer 131 of silicon, a source electrode 122, and a drain electrode 123. Preferably, the active layer 131 is made of polycrystalline silicon. The first substrate 100 may be made of glass or plastic, and may have a thickness of about 0.7 mm.

Figure 5B:
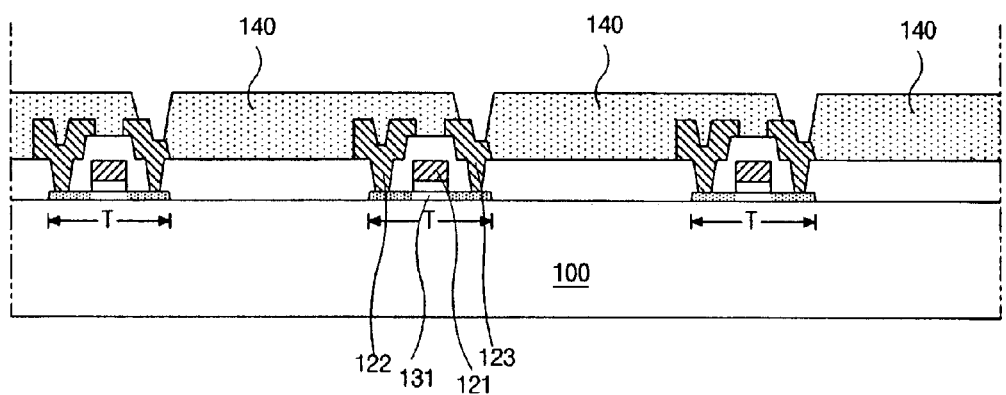

In FIG. 5B, a first passivation layer 140 may be formed on the TFT "T" through depositing and patterning organic or inorganic insulating materials. The first passivation layer 140 may include a drain contact hole that exposes the drain electrode 123. The organic insulating material may be composed of silicon nitride ($SiN_x$) or silicon oxide ($SiO_2$). The inorganic insulating material may be composed of benzocyclobutene (BCB) and photo acryl.

Figure 5C:
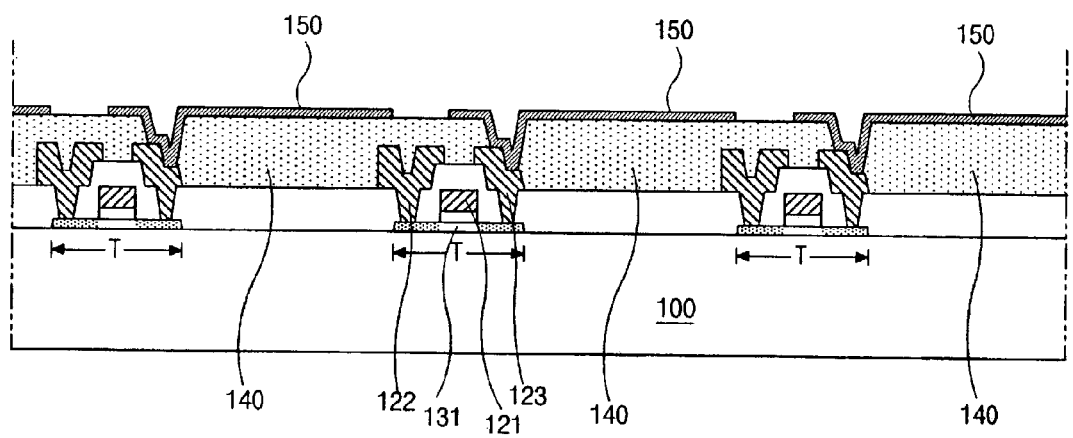

In FIG. 5C, a first electrode 150 may be formed on the first passivation layer 140 through depositing and patterning an opaque conductive material, such as metal. The first electrode 150 may be connected to the drain electrode 123 of the TFT "T" through the drain contact hole.

Figure 5D:
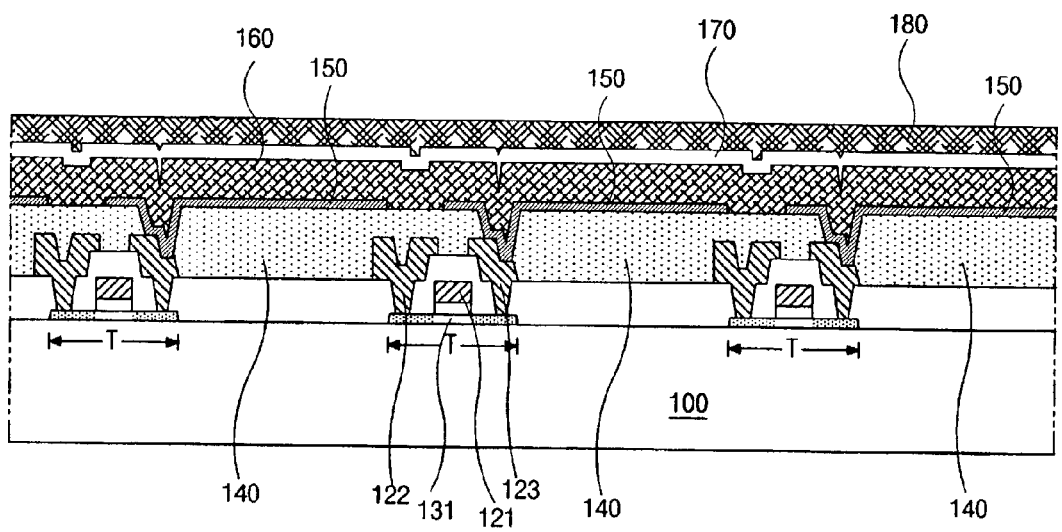

In FIG. 5D, an organic electroluminescent layer 160 emitting blue light may be formed on the first electrode 150. A second electrode 170 that may be made of a transparent conductive material, such as indium-tin-oxide (ITO) or indium-zinc-oxide (IZO), may be formed on the organic electroluminescent layer 160. A second passivation layer 180 may be formed on the second electrode 170. The second passivation layer 180 may also be made of organic or inorganic insulating materials.

Figure 6A:
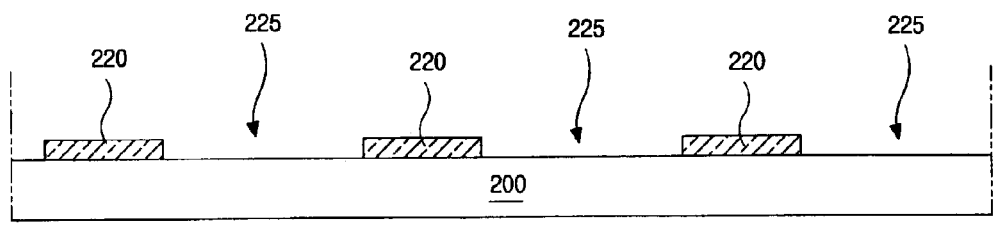
FIGS. 6A to 6D are cross-sectional views of an exemplary method of fabricating a second substrate for an organic electroluminescent display device according to the present invention.

In FIG. 6A, a black matrix 220 may be formed on a second substrate 200. The black matrix 220 may have a plurality of open portions 225. The second substrate 200 may be made of a transparent material, such as a glass or a plastic, and may have a thickness of about 0.5 mm.

Figure 6B:
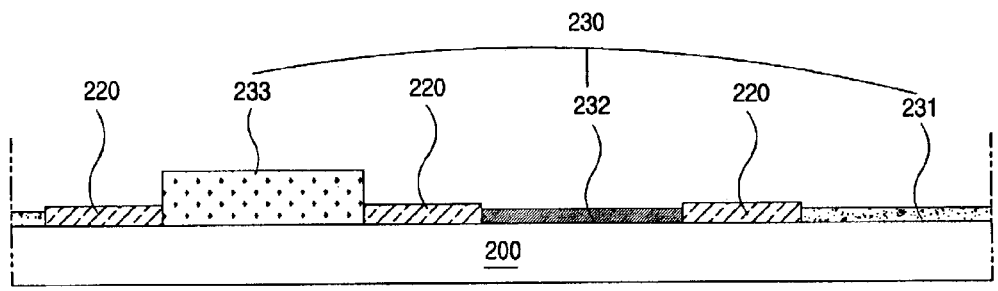

In FIG. 6B, a color filter layer 230 including first, second, and third sub-color filters 231, 232, and 233 may be formed at the plurality of open portions 225. The first, second, and third sub-color filters 231, 232, and 233, respectively corresponding to red, green and blue, may be formed sequentially through, for example, a pigment dispersion method, a dyeing method or an inkjet method. Here, each of the first, second, and third sub-color filters 231, 232, and 233 may be formed at one open portion 225.

Figure 6C:
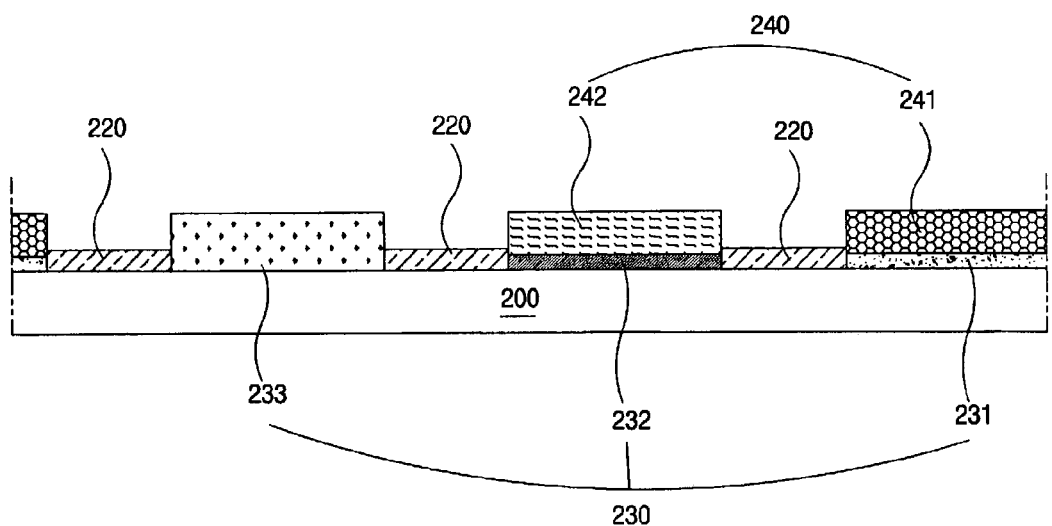

In FIG. 6C, a color changing layer 240 including first and second color changing mediums 241 and 242 may be formed on the color filter layer 230. Here, the first color changing medium 241 that changes the color of light passing through it to red may be formed on the first sub-color filter 231, and the second color changing medium 242 that changes the color of light passing through it to green may be formed on the second sub-color filter 232. Preferably, a sum of the thickness of the first sub-color filter 231 and the thickness of the first color changing medium 241 may be equal to the sum of the thickness of the second sub-color filter 232 and the thickness of the second color changing medium 242. Moreover, each of these sums may be equal to the thickness of the third sub-color filter 233.

Figure 6D:
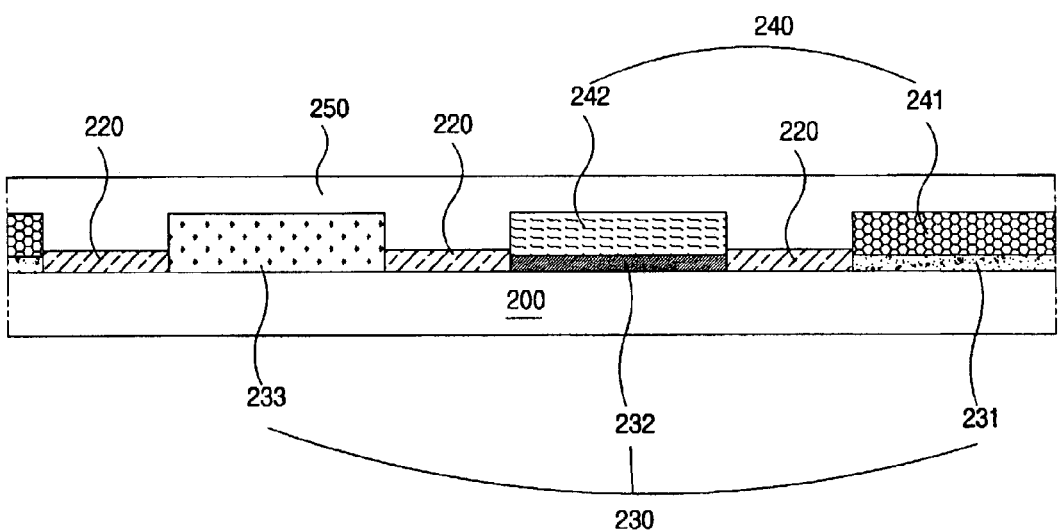

In FIG. 6D, an overcoat layer 250 may be formed on the color changing layer 240. Subsequently, the first substrate 100 on which the TFT "T" and the organic electroluminescent layer 160 have been formed and the second substrate 200 on which the color changing layer 240 has been formed may be disposed such that the second passivation layer 180 faces the overcoat layer 250. An organic electroluminescent display device may be completed by bonding the first and second substrates 100 and 200 together with an adhesive film 300 that adheres the second passivation layer 180 to the overcoat layer 250.

In the present invention, a large organic electroluminescent display device requiring a relatively small amount of power may be obtained by using a thin film transistor to drive the device. Moreover, a high display quality and equal expected life spans for elements may be obtained by forming one organic electroluminescent layer over an entire surface of a substrate and emitting light through a color changing layer. Furthermore, the described invention may have the effect of making an organic electroluminescent display device more damage-resistant because the formation of the thin film transistor and the color changing layer on different substrates that are later attached provides an additional substrate covering the elements to shield them from an external impact.

It will be apparent to those skilled in the art that various modifications and variations can be made in the organic electroluminescent display device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescent display device, comprising:
   a first substrate and a second substrate facing and spaced apart from each other;
   a thin film transistor on an inner surface of the first substrate;
   a first electrode connected to the thin film transistor;
   an organic electroluminescent layer on the first electrode;
   a second electrode on the organic electroluminescent layer;
   a passivation layer on the second electrode;
   a black matrix on an inner surface of the second substrate, the black matrix includes a plurality of open portions;
   a color filter layer at the plurality of open portions, the color filter layer includes first, second, and third sub-color filters;
   a color changing layer on the color filter layer, the color changing layer includes a first color changing medium on the first sub-color filter and a second color changing medium on the second sub-color filter;
   an overcoat layer on the color changing layer; and
   an adhesive film between the passivation layer and the overcoat layer,
   wherein a sum of a thickness of the first color changing medium and a thickness of the first sub-color filter is substantially equal to a thickness of the third sub-color filter.

2. The device according to claim 1, wherein each of the first, second, and third sub-color filters corresponds to one of the plurality of open portions.

3. The device according to claim 1, wherein the organic electroluminescent layer emits blue light.

4. The device according to claim 3, wherein the first color changing medium changes a color of light passing through the medium to red.

5. The device according to claim 3, wherein the second color changing medium changes a color of light passing through the medium to green.

6. The device according to claim 1, wherein a sum of a thickness of the second color changing medium and a thickness of the second sub-color filter is substantially equal to a thickness of the third sub-color filter.

7. The device according to claim 1, wherein the second electrode includes a transparent conductive material.

8. The device according to claim 7, wherein the first electrode includes an opaque conductive material.

9. The device according to claim 1, wherein the first substrate comprises glass and the second substrate comprises plastic.

10. A method of fabricating an organic electroluminescent display device, comprising steps of:
    forming a thin film transistor on a first substrate;
    forming a first electrode connected to the thin film transistor;
    forming an organic electroluminescent layer on the first electrode;
    forming a second electrode on the organic electroluminescent layer;
    forming a passivation layer on the second electroluminescent layer;
    forming a black matrix on a second substrate, the black matrix has a plurality of open portions;
    forming a color filter layer at the plurality of open portions, the color filter layer includes first, second, and third sub-color filters;
    forming a color changing layer on the color filter layer, the color changing layer includes a first color changing medium on the first sub-color filter and a second color changing medium on the second sub-color filter;
    forming an overcoat layer on the color changing layer; and
    bonding the first substrate to the second substrate by interposing an adhesive film between the passivation layer and the overcoat layer,
    wherein a sum of a thickness of the first color changing medium and a thickness of the first sub-color filter is substantially equal to a thickness of the third sub-color filter.

11. The method according to claim 10, wherein each of the first, second, and third sub-color filters corresponds to one of the plurality of open portions.

12. The method according to claim 10, wherein the organic electroluminescent layer emits blue light.

13. The method according to claim 12, wherein the first color changing medium changes a color of light passing through the medium to red.

14. The method according to claim 12, wherein the second color changing medium changes a color of light passing through the medium to green.

15. The device according to claim 10, wherein a sum of a thickness of the second color changing medium and a thickness of the second sub-color filter is substantially equal to a thickness of the third sub-color filter.

16. The method according to claim 10, wherein the second electrode includes a transparent conductive material.

17. The method according to claim 16, wherein the first electrode includes an opaque conductive material.

18. The method according to claim 10, wherein the first substrate includes glass and the second substrate includes plastic.

* * * * *